(12) United States Patent
Abedifard et al.

(10) Patent No.: US 8,644,060 B2
(45) Date of Patent: Feb. 4, 2014

(54) METHOD OF SENSING DATA OF A MAGNETIC RANDOM ACCESS MEMORIES (MRAM)

(75) Inventors: Ebrahim Abedifard, Sunnyvale, CA (US); Parviz Keshtbod, Los Altos, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/491,159

(22) Filed: Jun. 7, 2012

(65) Prior Publication Data

US 2013/0329488 A1  Dec. 12, 2013

(51) Int. Cl.
    *G11C 11/00* (2006.01)
(52) U.S. Cl.
    USPC ............ 365/158; 365/171; 365/189.07
(58) Field of Classification Search
    USPC .......................... 365/158, 171, 173
    See application file for complete search history.

(56) References Cited

U.S. PATENT DOCUMENTS

| 2009/0135642 A1* | 5/2009 | Kim et al. ............ 365/148 |
| 2009/0323402 A1* | 12/2009 | Li et al. ............ 365/158 |
| 2011/0157971 A1* | 6/2011 | Kim et al. ............ 365/171 |

* cited by examiner

*Primary Examiner* — Son Dinh
*Assistant Examiner* — Uyen B Tran
(74) *Attorney, Agent, or Firm* — Maryam Imam; IPxLAW Group LLP

(57) ABSTRACT

A MTJ is sensed by applying a first reference current, first programming the MTJ to a first value using the first reference current, detecting the resistance of the first programmed MTJ, and if the detected resistance is above a first reference resistance, declaring the MTJ to be at a first state. Otherwise, upon determining if the detected resistance is below a second reference resistance, declaring the MTJ to be at a second state. In some cases, applying a second reference current through the MTJ and second programming the MTJ to a second value using the second reference current. Detecting the resistance of the second programmed MTJ and in some cases, declaring the MTJ to be at the second state, and in other cases, declaring the MTJ to be at the first state and programming the MTJ to the second state.

7 Claims, 6 Drawing Sheets

METHOD OF SENSING DATA OF A MAGNETIC RANDOM ACCESS MEMORIES (MRAM)

BACKGROUND OF THE INVENTION

1. Field of the Invention

The invention relates to reading of magnetic memory and more particularly, to reliably reading magnetic Random Access Memory (RAM) such as spin-transfer torque magnetic random access memory (STTMRAM).

2. Description of the Prior Art

Magnetic random access memory (MRAM), such as spin transfer torque magnetic random access memory (STTM-RAM) is one of the next generations of non-volatile memory currently under development. During programming of the MRAMs, the magnetic junction of the MRAM is programmed to a '0' or '1' state by changing the resistance thereof, using current to effectuate the change in resistance. The data of the magnetic junction—magnetic tunnel junction (MTJ)—is considered to be '0' when the resistance of the MTJ is low when the orientation of the two magnets of the MTJ are aligned, and '1' when the magnetic orientation of the two junctions are in opposite or near opposite alignment. Since the resistance of the MTJ is inversely proportional to the MTJ area, in a large memory, the MTJ resistance varies across the die onto which the MRAM is formed and follows a Gaussian distribution. In a large memory, the low resistance of the MTJ has an average value with a certain variation around it specified with a certain sigma. The programmed MTJs have higher value of average resistance and also higher sigma because programming causes more variations in the resistance. To read the MTJ, data need be extracted and in this regard, a comparison is made between the resistance value of the MTJ being read to a reference MTJ that has the resistance value of:

$$Rref = (Rlavg + Rhavg)/2 \quad \text{Eq. (1)}$$

"Rref" represents the resistance of a reference MTJ, which is derived by calculating the average of the "Rlavg" and "Rhavg". "Rlavg" represents the average value of the distribution of "Rlow" and "Rhavg" is the average value of the distribution of "Rhigh". "Rlow" represents the resistance of the MTJ at a '0' or low state, whereas, "Rhigh" represents the resistance of the MTJ at a '1' or high state. For a better understanding, FIG. 1, well known in the art, is presented.

FIG. 1 shows a prior art graph of the resistance distribution of MTJs. The x-axis shows resistance while the y-axis shows the number of MTJs. Two Gaussian distributions are shown, one is the Rlow distribution and another is the Rhigh distribution. A reference resistance, "Rref", is shown to be in the central middle between Rlavg and Rhavg. The Rlow and Rhigh distributions are shown to be non-overlapping in FIG. 1 in that Rref is comfortably distant from these distributions allowing for reliable assessment of the value of Rlavg and Rhavg without concern for one being mistaken for the other.

However, occasionally, the Rlow and Rhigh distributions are not exactly reflected in FIG. 1 and in fact, some time they overlap, leading to erroneous sensing or reading of MTJs. Sensing presents a challenge when Rlow and Rhigh distributions are close or overlap. Thus, there is a need for a reliable sensing scheme for MRAMs when the R distributions are close or overlap.

IN THE DRAWINGS

Figure 5:
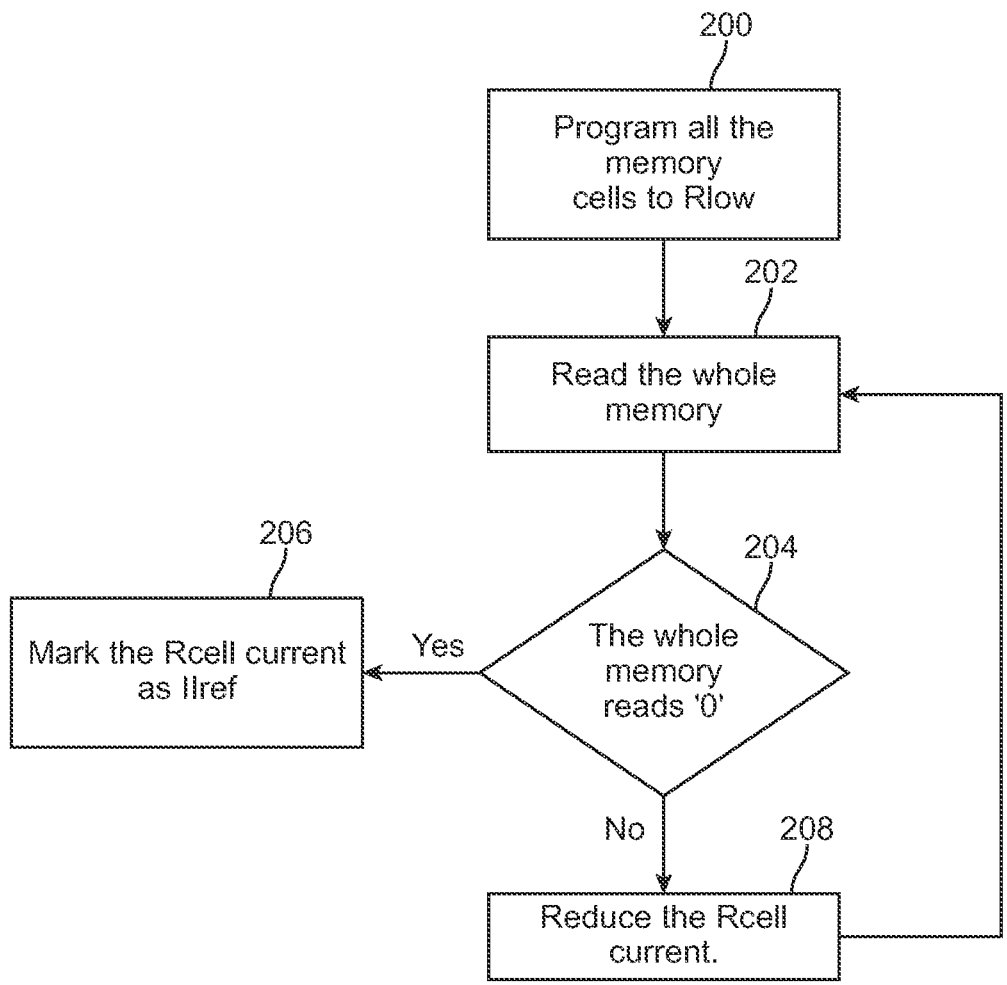
Figure 6:
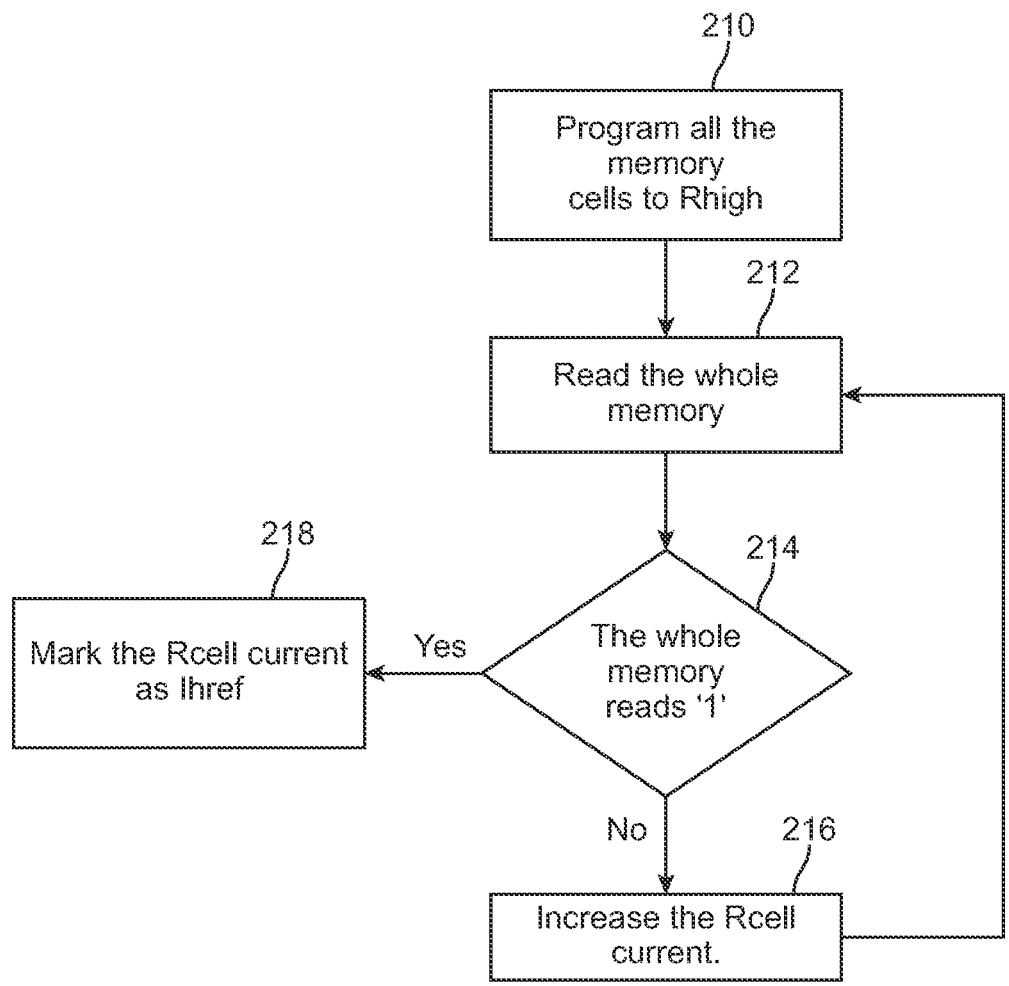

FIGS. 5 and 6, each show a flow chart of the process for generating Ilref and Ihref, respectively, in accordance with a method of the invention.

SUMMARY OF THE INVENTION

Briefly, a method of sensing a magnetic tunnel junction (MTJ) is performed by applying a first and second reference current through the MTJ detecting the resistance of the first MTJ, determining if the detected resistance is above a first and second reference resistor and if so, declaring the MTJ to be at a first state. If not, determining if the detected resistance is below the first and second reference resistance and if so, declaring the MTJ to be at a second state. If the detected resistance is above a first but below the second reference resistor then the state of the MTJ is ambiguous. The MTJ then is programmed to a second value and using the first and second reference current the state of the MTJ is detected. If the resistance of the programmed MTJ is above the first and second reference resistance then, declaring the MTJ to be at the second state and programming the MTJ to the second state, and if not, declaring the MTJ to be at the first state.

These and other objects and advantages of the invention will no doubt become apparent to those skilled in the art after having read the following detailed description of the preferred embodiments illustrated in the several figures of the drawing.

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

Figure 1:
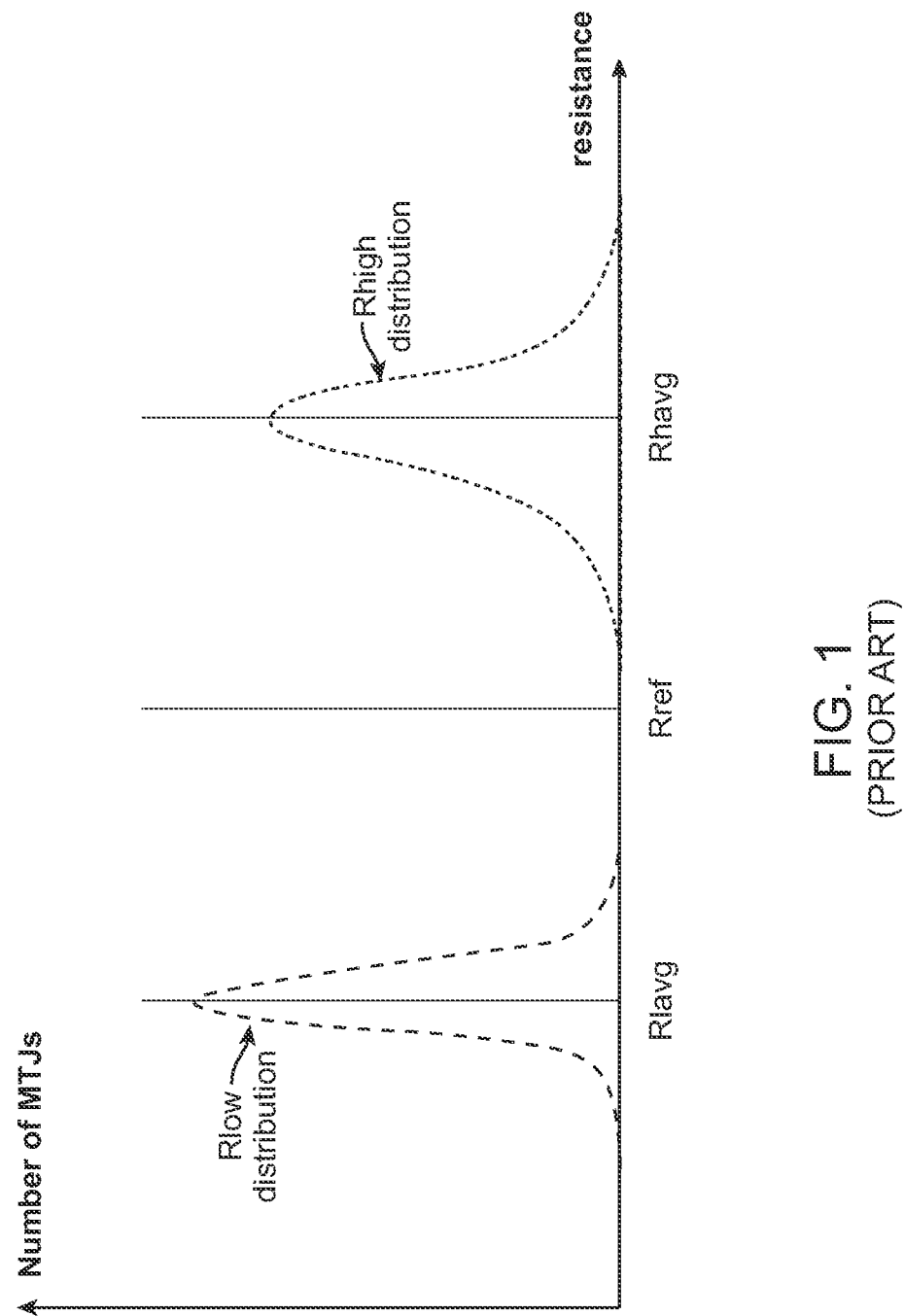
FIG. 1 shows a prior art graph of the resistance distribution of MTJs.
Figure 2:
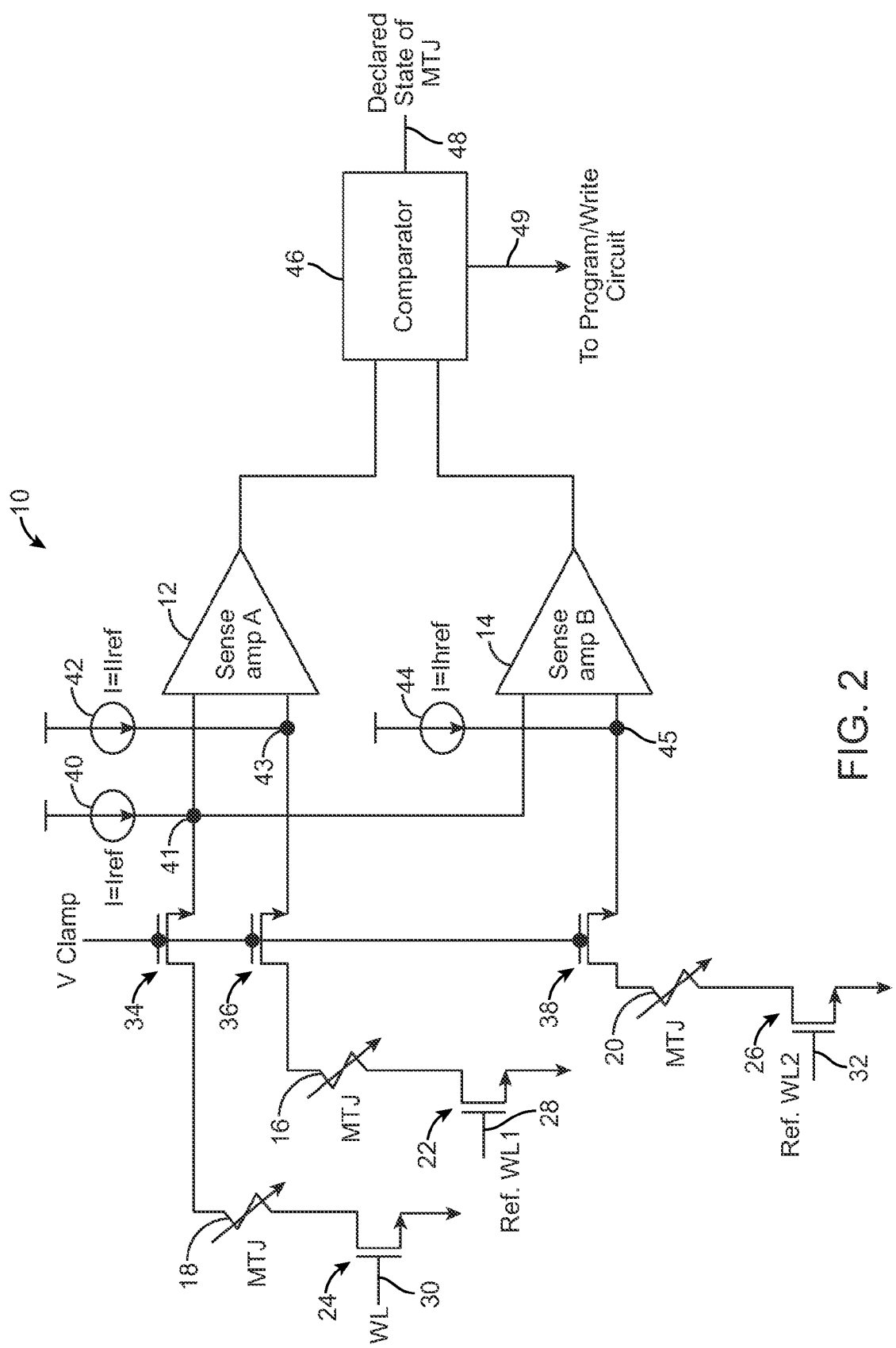
FIG. 2 shows a magnetic tunnel junction (MTJ) reading device 10, in accordance with an embodiment of the invention.

FIG. 2 shows a system design 10 for reading and comparing the MTJ resistance with respect to the two MTJs, in accordance with an embodiment of the invention. The device 10 is shown to include a sense amplifier 12, a sense amplifier 14, MTJ 16, MTJ 18, MTJ 20, access transistor 26, access transistor 28, access transistor 30, current source 40, current source 42, current source 44, transistors 34-38, and comparator block 46. The sense amplifiers 12 and 14 are shown to output to the comparator block 46, which outputs either the declared state of the MTJ and, at times, a signal 49 going to a program/write circuit to indicate re-programming of the MTJ is required.

In some embodiments, the MTJ is a part of a magnetic random access memory (MRAM) element, such as a spin-transfer torque magnetic random access memory (STTM-RAM) element, however, other types of magnetic memory is contemplated.

The access transistor 24 is shown coupled, at its gate, to a word line 30 and at its source to ground and at its drain to the MTJ 18. The transistor 22 is shown coupled at its gate to a reference word line 28, at its source to ground and at its drain to the MTJ 16. The access transistor 26 is shown coupled at its gate to a reference word line 32, at its source to ground and at its drain to the MTJ 20. The MTJ 18, at an end opposite to that which is coupled to the access transistor 24 is shown coupled to the transistor 34, at the transistor 34's gate. The transistor 34 is shown coupled at its gate to a voltage, such as Vcc. Similarly, the MTJs 16 and 20 are coupled to transistors 36 and 38, respectively. The gates of each of the transistors 36 and 38 is shown coupled to the voltage that the transistor 34 is coupled to.

The MTJ 16, at an end that is opposite to that which is shown coupled to the transistor 36, is shown coupled to the drain of the transistor 22. Similarly, the MTJ 20, at an end that is opposite to that which is shown coupled to the transistor 38, is shown coupled to the drain of the transistor 26. Each of the transistors 34-38 is also shown coupled to one of the sense amplifiers. For example, the transistor 34 is shown coupled, at its source, to the sense amplifier 12 and the transistor 36 is shown coupled, at its source, to the sense amplifier 12, and the transistor 38 is shown coupled, at its source, to the sense amplifier 14.

The sense amplifier 12 is shown to also receive, as input the output of the current source 40 and at another input, the output of the current source 42. The sense amplifier 14 is shown to receive as input, the output of the current source 44, and at another input, the output of the current source 40. The output of the current source 42 is represented by "Ilref", which is essentially the current value used to read the MTJ when the resistance of the MTJ is presumed to be at within a high resistance distribution ("Rhigh" distribution), further discussed below. The output of the current source 40 is represented by "Ihref", which is essentially the current value used to read the MTJ when the resistance of the MTJ is presumed to be at within a low resistance distribution ("Rlow" distribution), further discussed below.

It is noted that the MTJs 16, 18, and 20, in combination, are used to read a single MTJ namely MTJ 18. Three MTJs are employed in the embodiment of FIG. 2 to be able to compare the resistance value of the MTJ 18 with two reference MTJs to establish whether MTJ 18 is part of Rhigh distribution or it is part of Rlow distribution or it is where the two distributions overlap.

While, the device 10 is shown to include three MTJs, it is understood that MTJ 18 is one MTJ from a large array of MTJs.

Because two reference resistances are used to read an MTJ, two reference word lines, word lines 28 and 32, are required in addition to the conventionally required word line 30. Reference resistance, referred to herein as "Rref1" and "Rref2" are either Ravg or the average of the low values of the MTJs. In the embodiment of this patent the resistance values of the MTJs 16 and 20 are Rlow or some average value of Rlows. The voltage differences needed at the sense amplifiers 12 and 14 to distinguish the value of MTJ 18 are created by using different currents in current sources 40, 42 and 44.

In operation three different values of current sources are used to establish where in R distributions MTJ 18 is situated. The current values of Ilref, Ihref, and Iref are all pre-determinent at initial sort. The technique of acquiring these values will be discussed shortly. Generally Iref is chosen arbitrarily based on the sensitivity of the sense amplifiers and circuit design requirements. With respect to the Iref value Ihref is chosen so that every MTJ in the Rhigh distribution (shown in FIG. 3) would yield a '1' at the output of the sense amp B. The Ilref on the other hand is chosen so that every MTJ in the Rlow distribution would yield a '0' in the output of the sense amp A.

Therefore if the resistance of the MTJ 18 is at the point 108 (shown in FIG. 3) then both sense amps A and B yield '1' at their outputs meaning the data is for sure 1. If the MTJ R is at the point 106 (shown in FIG. 3) then both sense amps A and B yield 0' at their outputs meaning the data is for sure 0. But if the MTJ R is located at a point like 102 (shown in FIG. 3) then sense amps A would yield '0' while sense amp B yield '1' at their outputs then we cannot be sure what the status of the MTJ is. Similarly with point 104, sense amps A would yield '0' while sense amp B yield '1' at their outputs then we cannot be sure what the status of the MTJ is. In this situation the comparator (similar to XOR in function) at the outputs of the sense amps A and B would indicate that the state of the data is unknown. To resolve this uncertainty the MTJ 18 will be programmed from low R to high R. In the case where the MTJ is part of the Rhigh distribution, such as shown at point 102 in FIG. 3, the MTJ resistance does not change, which indicates that the MTJ is part of Rhigh distribution and the data is actually '1'. On the other hand, if the MTJ resistance increases, shown at point 103 and going to point 105, in FIG. 3, on the Rhigh distribution, the output of both sense amplifiers 12 and 14 of FIG. 2 are '1'. This indicates that the MTJ belongs to Rlow distribution and the output data in fact is '0'. In this case in order not to alter the data in the part one needs to reprogram MTJ 18 back to its Rlow state.

To summarize, an MTJ in the embodiment of FIG. 2 is read twice (or sensed) by applying a first reference current through the MTJ, and comparing it to two reference MTJs with two second and third reference currents, detecting whether the resistance of the first MTJ, determining if the detected resistance is above the first and second reference resistor and if so, declaring the MTJ to be at a first state. If not, determining if the detected resistance is below the first and second reference resistor if so, declaring the MTJ to be at a second state. If not then the MTJ is at the unknown state, and then programming the MTJ to the first state. If the MTJ moves to the first state then it must have been in the second state, and need to be reprogrammed to the second state. In the last step, the MTJ is essentially restored to its initial state prior to the time the reading/sensing began. If the MTJ programming did not move the MTJ from second state to the first state, then the MTJ must have been already in the first state, nothing further is required.

In FIG. 2, the current source 40 provides current through the transistor 34, the MTJ 18, and the transistor 24 and in this respect generates a voltage at node 41. Similarly, the current source 42 provides current through the transistor 36, the MTJ 16, and the transistor 22 and in this respect generates a voltage at node 43. Still similarly, the current source 44 provides current through the transistor 38, the MTJ 20, and the transistor 26 and in this respect generates a voltage at node 45.

When the sense amplifier 12 senses the voltages at nodes 41 and 43, it generates an output that is based on these voltages and representative of the resistance of the MTJ 18 and 16 because of the relationship of voltage to resistance, as readily known to those in the art. Analogously, the sense amplifier 14 senses the voltages at nodes 41 and 45, it generates an output that is based on these voltages and representative of the resistance of the MTJ 18 and 20.

The voltage across the MTJ 18, if greater than that of the MTJ 16, node 41's voltage is greater than the voltage at node 43. Similarly, if the voltage across the MTJ 18 is greater than that of the MTJ 20, the voltage at node 41 is greater than the voltage at node 45. If the voltage at node 41 is greater than the voltage at node 43, the output of the sense amplifier 12 is '1'. Similarly, if the voltage at node 41 is greater than the voltage at node 45, the output of the sense amplifier 14 is '1'. The comparator 46 compares the outputs of the sense amplifiers 12 and 14 and because, in this case, these outputs are at the same state, the comparator 46 declares its output 48 to be a predetermined state, such as '1'. In the foregoing case, the output 48 is '1', the state of the MTJ 18 is reliably determined, and in this case is '1'.

In the case where the voltage at the node 41 is less than the voltage at node 43, the output of the sense amplifier 12 is '0'. Similarly, if the voltage at node 41 is less than the voltage at node 45, the output of the sense amplifier 14 is '0'. The output of the comparator 46, output 48, is '1' but indicating the state of the MTJ 18 is reliably declared, and in this case is '0'. Thus, the state of the output 48 is determinative of the reliable declaration of the state of the MTJ 18.

In the case where the voltage at node 41 is greater than that of the node 43 but is less than the voltage at the node 45, or vice verse, the output of the sense amplifier 12 is not the same as that of the sense amplifier 14 rendering the output 48 to be '0' indicating the state of the MTJ 18 to be unknown (or not reliably determined). In this case, the resistance of the MTJ 18 is in a resistance distribution area where distributions Rlow and Rhigh overlap. In this case, the MTJ 18 is programmed and possibly re-programmed depending on its state, as described herein relative to FIG. 4. Resistance distributions are discussed relative to subsequent figures, below.

As will be further evident relative to the discussion of FIG. 3 below, the two reference currents, Ihref and Ilref, are generated during manufacturing of the die onto which the device 10 of FIG. 2 is formed. This is because reading resistance (R) values are cumbersome therefore, instead of reading R, current values are read, values that suitably activate (or trip) the sense amplifiers of FIG. 2 during sensing. Assuming the activation (or trip) voltage required for such sense amplifiers to be represented by "DV", the following relationship is maintained:

$$DV=+/-I*(R-Rref) \quad \text{Eq. (2)}$$

Wherein "R" represents the resistance of the MTJ 18, "Rref" represents the resistance of the reference MTJs, in the case of FIG. 2, this is the resistance of the MTJ 16 or the MTJ 20, and "I" represents the current flowing through the reference MTJ(s).

Because the value of the reference resistance, Rref, and DV are constant, the distribution of R can be represented by the distribution of I (some-what in reverse, i.e. when R is high, I is low and vice versa). In this manner, Ilref is determined for reading the data in Rhigh (high resistance distribution) and Ihref is determined for reading the data in R low distribution.

During manufacturing, Ilref and Ihref are each generated for use during the operation of the device 10, after manufacturing. FIGS. 5 and 6, each show a flow chart of the process for generating Ilref and Ihref, respectively. These steps are performed to ultimately determine the value of the Ilref and Ihref of current sources 42 and 44, respectively. Similarly, Iref of the current source 40 is determined.

As will discussed in further detail relative to FIGS. 5 and 6 below, to establish Iref, the reference current for the Rlow distribution, the entire magnetic memory array, such as that a part of which is shown in FIG. 2, is programmed to Rlow. The reference resistor is the average of (Rhigh+Rlow)/2 positioned somewhere on the die. If the current through the reference resistor is Iref, and the current through the MRAM cell is Icell, then the voltage across the sense amp is represented as follows:

$$DV=Iref*Rref-Icell*Rlow \quad \text{Eq. (3)}$$

,and when $Iref=Icell$ $$DV=Icell*(Rref-Rlow) \quad \text{Eq. (4)}$$

A memory cell, such as a MRAM cell, as used herein, generally refers to a MTJ and a corresponding access transistor. A MRAM element is sometimes, as used herein, referred to as a MTJ. In cases where the two distributions (Rlow and Rhigh) do not overlap, and Rlow is always smaller than Rref, all the cells (except the defective cells that need to be replaced with redundancy) are read with the, Icell=Iref condition. But when the two (Rlow and Rhigh) distributions overlap, when Rlow is smaller than Rref, the state is determined to be '0', which is the correct data. But when Rlow becomes larger than Rref the incorrect state (or "data") of '1' is determined, and when Rlow=Rref, the state is unknown, and random. The current level that causes all the Rlow's to yield a state '0' need be determined. In order to do that, the Icell (in Eq. (3)) is determined and reading of the entire memory is performed. Every time the Icell is reduced further, additional magnetic memory cells (or MTJs) get to the state '0' and less remain in state '1'.

In exemplary embodiments, the size of the memory is presumed to be 16 Mega bytes, and Icell=Iref=30 uA. In Eq. (4), when Icell=Iref, as long as Rref>Rlow, the DV is positive and the output settles to 0, but when Rref=Rlow, or Rref<Rlow the DV is either 0 or negative which results in random or 1 on the output. By reducing the Icell as it is shown in Table 1 the DV in Eq. (3) can become positive which results in 0 at the output. At some current level almost all the cells are read as 0, except perhaps some defective ones that need to be replaced by redundancy. This current level is the low reference current and is called Ilref. This means that, in this example if we use 30 uA as Iref, and 15 uA as Icell (here we call it Ilref), all the cells programmed to Rlow will yield a 0 at the output and Eq. 3 becomes:

$$DV=Iref*Rref-Ilref*Rlow \quad \text{Eq. (5)}$$

Reference Current for Rhigh distribution (Ihref): To get Ihref we program all the cells to Rhigh at the initial test of the die. This time the Eq. (4) becomes:

$$DV=Iref*Rref-Icell*Rhigh \quad \text{Eq. (6)}$$

And as long as Rhigh>Rref and Iref=Icell, DV is negative and the output yields 1. But when the distributions of Rhigh and Rlow overlap, Rhigh could become less than Rref, resulting of a 0 in the output. Similar to the procedure of finding Ilref we can start increasing the value of Icell in Eq. (6) until DV becomes negative for all the cells, resulting of a 1 for all the cells. This smallest value of Icell that yields 1 for all the cells is Ihref. These two values of Ilref and Ihref, are stored in the form of reference current trim values and used for sensing the data in the die.

The Ilref corresponds to the highest values of R's in the Rlow distribution, and Ihref corresponds to the lowest values of R's in the Rhigh distribution. These reference currents are produced by the current sources in the sense amplifier.

It is understood that the MTJs 18, 16, and 18 of the embodiment of FIG. 2 are a part of a memory array.

Figure 3:
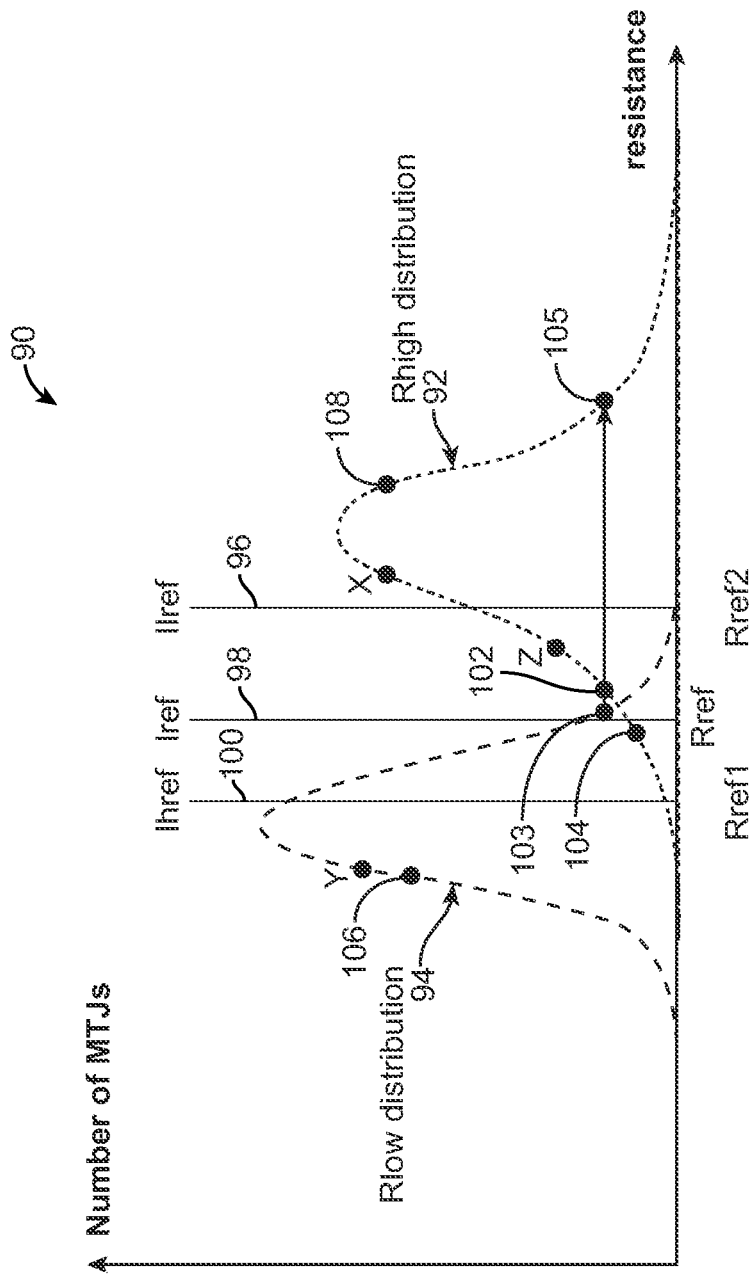
FIG. 3 shows a flow chart of the relevant steps performed by the device 10 during reading of an MTJ.

FIG. 3 shows a graph of the resistance distribution of MTJs that are employed in sensing schemes of the invention. Graph 90 shows resistance, in the x-axis, and the number of MTJs, in the y-axis. All of the MTJs, in the embodiment of FIG. 2 are part of these distributions. The Rhigh resistance distribution 92 is a Gaussian-shaped distribution curve distributed around a Rhigh resistance of the MTJ whereas the Rlow resistance distribution 94 is a Gaussian-shaped distribution curve distributed around a Rlow resistance of the MTJ. Nearly centrally located between the distributions 92 and 94 is Rref associated with a current value of Iref 98. To the right of Rref and a distance into the distribution 92, is shown Rref2 associated with a Ilref 96 current value. To the left of Rref and a distance into the distribution 94, is shown Rref1 associated with a Ihref 100 current value.

Figure 4:
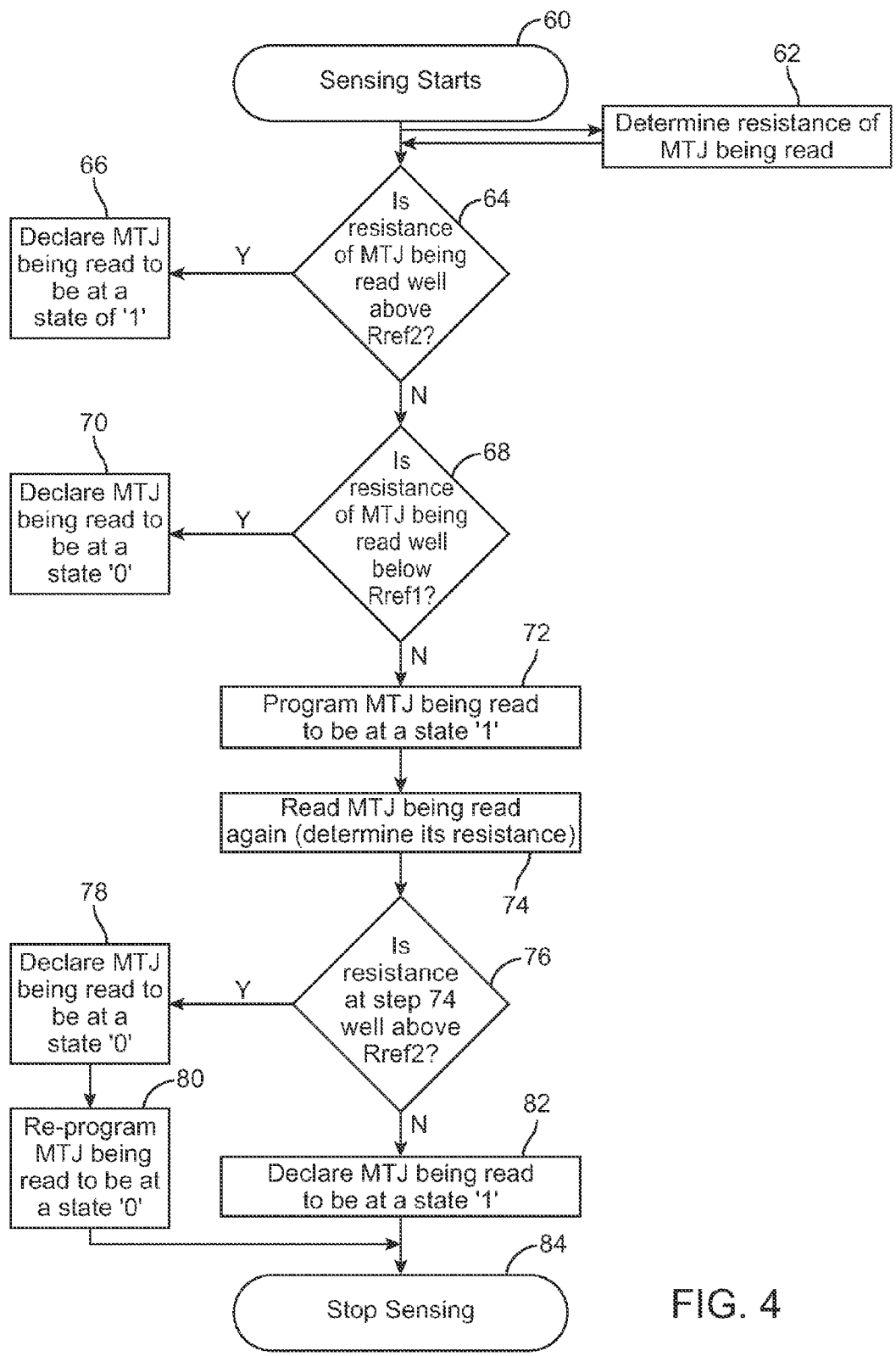
FIG. 4 shows a graph of the resistance distribution of MTJs that are employed in sensing schemes of the invention.

Certain points, such as points 102-108, are identified in the graph 90 to relate the graph 90 to the flow chart of FIG. 4. Namely, point 108 of graph 90 shows the declared state at the step 66, the point 106 shows the declared state at step 70, the point 105 identifies the state at step 78, after programming of step 72, which resulted in the initial state of the point 105, in the graph 90, being at 102. That is, 102 represents the initial state of the MTJ to which it must be restored at step 80. Point 104 identifies the state of the MTJ after 76, in FIG. 3.

FIG. 4 shows a flow chart of the relevant steps performed by the device 10 during reading of an MTJ. At 60, the reading or "sensing" process starts. Next, at step 62, a determination is made as to the resistance of the MTJ that is to be read. That is, the resistance of the MTJ to be read (the "MTJ" with reference to FIG. 3) is determined. Next, at 64, it is determined whether or not, the resistance of the MTJ is well above Rref2 and if so, the process proceeds to the step 66 where the MTJ is declared to be at a certain state, for example, '1'. If not, the process proceeds to 68 where it is determined whether or not, the resistance of the MTJ is well below Rref1. "Well" below or "well" above refers to a suitable threshold level that is representative of a reference resistance.

If at 68, it is determined that the MTJ is well below Rref1, the process continues to step 70 where the MTJ is declared to be at a state opposite to that of the step 66, or '0'. Otherwise, the process proceeds to step 72 where the MTJ is programmed to state '1'. This is done to essentially widen the gap of resistance in the event of an overlap to more reliably detect the state of the MTJ. Next, at step 74, the MTJ is read or its resistance is measured. Next, at 76, a determination is made as to whether or not the resistance of the MTJ, as read at step 74, is well above Rref2 and if so, the process continues to step 78 where the MTJ is declared to be at the same state as that of the step 70, or '0' in this example, otherwise, the process continues to the step 82 where the MTJ is declared to be at state opposite to that of the state at step 78, or '1' in this example. After the step 82, the process comes to an end where sensing stops at 84.

If at 76, it is determined that the resistance, measured at step 74, is not well above Rref2, the process continues to step 78 where the MTJ is declared to be at a state as that of the step 70, or '0', and the process continues onto step 80. At step 80, the MTJ needs to be re-programmed because it would have initially been at a state opposite to that read at step 78, or '1' in this case, but due to the programming at step 72, its initial state is altered and must therefore be restored. Thus, at step 80, the MTJ is re-programmed back to '0'.

In some embodiments, the step 62 is a part of the decision at 64 and still in some other embodiments, some of the other steps of FIG. 4 may be combined and/or decisions made in a different order. Regarding the latter, for example, the decision at 68 may be made prior to the decision at 64.

As earlier noted, FIGS. 5 and 6, each show a flow chart of the process for generating Ilref and Ihref, respectively, in accordance with a method of the invention. In FIG. 5, the process starts at step 200 where all of the memory cells of a memory array are programmed to Rlow. Next, at step 202, the entire memory array is read and at 204, a determination is made as to whether the memory cells of the read memory array are all '0'. If not, the process continues to step 208 where the current applied to the reference memory cells of the memory array is reduced and the process then goes back to step 202 and continues from there. If at 204, it is determined that the memory cells are all at '0', or substantially all at '0', the process continues to step 206 where the current of the reference memory cells is marked as Ilref. That is, basically, Ilref is identified. In summary, the cells of the memory array are programmed to a low resistance, or Rlow, and the memory array is read and unless all, or at least substantially all, of the cells of the memory array are at '0', the current through the reference memory cells is reduced until all or a substantial number of memory cells are at '0', at which time, Ilref is identified.

In FIG. 6, the process starts at step 210 where all of the memory cells of a memory array are programmed to Rhigh. Next, at step 212, the entire memory array is read and at 214, a determination is made as to whether the memory cells of the read memory array are all '1'. If not, the process continues to step 216 where the current applied to the reference memory cells of the memory array is increased and the process then goes back to step 212 and continues from there. If at 214, it is determined that the memory cells are all at '1', or substantially all at '1', the process continues to step 218 where the current of the reference memory cells is marked as Ihref. That is, basically, Ihref is identified. In summary, the cells of the memory array are programmed to a high resistance, or Rhigh, and the memory array is read and unless all, or at least substantially all, of the cells of the memory array are at '1', the current through the reference memory cells is increased until all or a substantial number of memory cells are at '1', at which time, Ihref is identified.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A method of sensing a magnetic tunnel junction (MTJ) comprising:
   applying a first reference current through the MTJ;
   first programming the MTJ to a first value using the first reference current;
   detecting the resistance of the first programmed MTJ;
   determining if the detected resistance is above a first reference resistor and if so, declaring the MTJ to be at a first state;
   if not, determining if the detected resistance is below a second reference resistance and if so, declaring the MTJ to be at a second state;
   if not, applying a second reference current through the MTJ and second programming the MTJ to a second value using the second reference current;
   detecting the resistance of the second programmed MTJ;
   determining if the resistance of the detected second programmed MTJ is above the first reference resistance and if so, declare the MTJ to be at the second state; and
   if not, declaring the MTJ to be at the first state and programming the MTJ to the second state.

2. A method of determining reference currents for a magnetic random access memory (MRAM) reference cell of a memory array, the MRAM reference cell being employed when reading MRAM cells of the memory array, the method comprising:
   a. programming all of the MRAM cells to a first value by causing their resistances to be at Rlow;
   b. reading the memory array;
   c. first determining if the MRAM cells of the memory array are at a first state and if so, second determining a first reference current value to be used when reading a MRAM cell of the memory array; and d. if the MRAM cells of the memory array are not at the first state, reducing the current of the MRAM reference cell and repeating steps c. and d. until all of the MRAM cells of the memory array are at the first state.

3. The method of determining reference currents, as recited in claim 2, further including, e. programming all of the MRAM cells to a second value by causing their resistances to be at Rhigh;

f. reading the memory array;

g. third determining if the MRAM cells of the memory array are at a second state and if so, fourth determining a second reference current value to be used when reading a MRAM cell of the memory array; and h. if the MRAM cells of the memory array are not at the second state, increasing the current of the MRAM reference cell and repeating steps g. and h. until all of the MRAM cells of the memory array are at the second state.

4. The method of determining reference currents, as recited in claim 3, wherein the first reference current value is Ilref.

5. The method of determining reference currents, as recited in claim 3, wherein the first reference current value is Ihref.

6. The method of determining reference currents, as recited in claim 3, wherein the Rlow falls within a low resistance distribution curve and the Rhigh falls within a high resistance distribution curve, the low resistance distribution curve and the high resistance distribution curve overlapping at least in part.

7. The method of determining reference currents, as recited in claim 3, further including, applying a first reference current through the MTJ;

first programming the MTJ to a first value using the first reference current;

detecting the resistance of the first programmed MTJ;

determining if the detected resistance is above a first reference resistor and if so, declaring the MTJ to be at a first state;

if not, determining if the detected resistance is below a second reference resistance and if so, declaring the MTJ to be at a second state;

if not, applying a second reference current through the MTJ and second programming the MTJ to a second value using the second reference current;

detecting the resistance of the second programmed MTJ;

determining if the resistance of the detected second programmed MTJ is above the first reference resistance and if so, declare the MTJ to be at the second state; and if not, declaring the MTJ to be at the first state and programming the MTJ to the second state.

* * * * *